United States Patent
Wang et al.

(10) Patent No.: US 10,801,953 B2
(45) Date of Patent: Oct. 13, 2020

(54) SEMICONDUCTOR METROLOGY BASED ON HYPERSPECTRAL IMAGING

(71) Applicant: KLA-Tencor Corporation, Milpitas, CA (US)

(72) Inventors: David Y. Wang, Santa Clara, CA (US); Alexander Buettner, Weilburg (DE); Stilian Ivanov Pandev, Santa Clara, CA (US); Emanuel Saerchen, Giessen (DE); Andrei V. Shchegrov, Campbell, CA (US); Barry Blasenheim, Campbell, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/245,695

(22) Filed: Jan. 11, 2019

(65) Prior Publication Data

US 2020/0225151 A1    Jul. 16, 2020

(51) Int. Cl.
*G01J 3/28* (2006.01)
*G01N 21/3563* (2014.01)
(Continued)

(52) U.S. Cl.
CPC ........ *G01N 21/3563* (2013.01); *G01J 3/2823* (2013.01); *G01N 21/211* (2013.01);
(Continued)

(58) Field of Classification Search
CPC ............. G01N 21/3563; G01N 21/211; G01N 2201/08; G01N 2021/213;
(Continued)

(56) References Cited

U.S. PATENT DOCUMENTS

| 5,166,752 A | 11/1992 | Spanier et al. |
| 5,608,526 A | 3/1997 | Piwonka-Corle et al. |

(Continued)

FOREIGN PATENT DOCUMENTS

| EP | 2184577 A1 | 5/2010 |
| EP | 1570232 B1 | 11/2016 |
| KR | 10-2011-0105852 A | 9/2011 |

OTHER PUBLICATIONS

International Search Report dated May 6, 2020, for PCT Application No. PCT/US2020/012816. Filed on Jan. 9, 2020 by KLA Corporation, 4 pages.

*Primary Examiner* — Abdullahi Nur
(74) *Attorney, Agent, or Firm* — Spano Law Group; Joseph S. Spano

(57) ABSTRACT

Methods and systems for performing semiconductor measurements based on hyperspectral imaging are presented herein. A hyperspectral imaging system images a wafer over a large field of view with high pixel density over a broad range of wavelengths. Image signals collected from a measurement area are detected at a number of pixels. The detected image signals from each pixel are spectrally analyzed separately. In some embodiments, the illumination and collection optics of a hyperspectral imaging system include fiber optical elements to direct illumination light from the illumination source to the measurement area on the surface of the specimen under measurement and fiber optical elements to image the measurement area. In another aspect, a fiber optics collector includes an image pixel mapper that couples a two dimensional array of collection fiber optical elements into a one dimensional array of pixels at the spectrometer and the hyperspectral detector.

23 Claims, 9 Drawing Sheets

(51) Int. Cl.
*H01L 21/66* (2006.01)
*G01N 21/21* (2006.01)

(52) U.S. Cl.
CPC ........ *H01L 22/12* (2013.01); *G01N 2021/213* (2013.01); *G01N 2021/3568* (2013.01); *G01N 2201/08* (2013.01)

(58) Field of Classification Search
CPC .. G01N 2021/3568; G01J 3/2823; G01J 3/28; G01J 3/26; G01J 3/02; H01L 22/12
See application file for complete search history.

(56) References Cited

U.S. PATENT DOCUMENTS

| | | |
|---|---|---|
| 5,808,738 A | 9/1998 | Garcia-Rubio |
| 5,859,424 A | 1/1999 | Norton et al. |
| 6,429,943 B1 | 8/2002 | Opsal et al. |
| 6,633,831 B2 | 10/2003 | Nikoonahad et al. |
| 6,734,967 B1 | 5/2004 | Piwonka-Corle et al. |
| 6,816,570 B2 | 10/2004 | Janik et al. |
| 6,859,278 B1 | 2/2005 | Johs et al. |
| 6,895,075 B2 | 5/2005 | Yokhin et al. |
| 6,972,852 B2 | 12/2005 | Opsal et al. |
| 7,478,019 B2 | 1/2009 | Zangooie et al. |
| 7,755,764 B2 | 7/2010 | Kwak et al. |
| 7,826,071 B2 | 11/2010 | Shchegrov et al. |
| 7,907,264 B1 | 3/2011 | Krishnan |
| 7,929,667 B1 | 4/2011 | Zhuang et al. |
| 7,933,026 B2 | 4/2011 | Opsal et al. |
| 8,860,937 B1 | 10/2014 | Dziura et al. |
| 9,291,554 B2 | 3/2016 | Kuznetsov et al. |
| 9,310,290 B2 | 4/2016 | Wang et al. |
| 9,915,522 B1 | 3/2018 | Jiang et al. |
| 2005/0174584 A1 | 8/2005 | Chalmers et al. |
| 2008/0042071 A1 | 2/2008 | Harrison |
| 2010/0110427 A1* | 5/2010 | Amary ................ G01J 3/2823 356/302 |
| 2012/0250032 A1 | 10/2012 | Wilde et al. |
| 2013/0114085 A1 | 5/2013 | Wang et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2014/0316730 A1 | 10/2014 | Shohegrov et al. |
| 2014/0375983 A1 | 12/2014 | Wolf et al. |
| 2015/0042984 A1 | 2/2015 | Pandev et al. |
| 2015/0046118 A1 | 2/2015 | Pandev et al. |
| 2015/0193926 A1 | 7/2015 | Berlatzky et al. |
| 2015/0204664 A1 | 7/2015 | Bringoltz et al. |
| 2016/0139032 A1 | 5/2016 | Rampoldi et al. |
| 2016/0161245 A1 | 6/2016 | Fu et al. |
| 2018/0061691 A1* | 3/2018 | Jain ........................ H01L 22/12 |

\* cited by examiner

SEMICONDUCTOR METROLOGY BASED ON HYPERSPECTRAL IMAGING

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry, ellipsometry, and reflectometry implementations and associated analysis algorithms are commonly used to characterize critical dimensions, film thicknesses, composition, overlay and other parameters of nanoscale structures.

Non-imaging, model-based optical metrology techniques generally acquire measurement signals over very small measurement areas (e.g., measurement areas of having dimensions of less than 100 micrometers by 100 micrometers). As a result, non-imaging, model-based optical measurements are generally performed sequentially at different metrology target locations sparsely scattered over the field area of a semiconductor wafer. Although non-imaging, model-based optical metrology techniques offer high precision measurement capability, the number of locations that can be measured for a given wafer throughput requirement is limited.

In semiconductor manufacture, and patterning processes in particular, process control is enabled by performing metrology on specific dedicated structures. These dedicated structures may be located in the scribe lines between dies, or within the die itself. The measurement of dedicated metrology structures by traditional non-imaging, model-based metrology techniques is time consuming.

In contrast, imaging based measurement systems collect large numbers of signals in parallel. Thus, the wafer area that can be characterized by imaging-based measurements for a given wafer throughput requirement is much larger compared to non-imaging, model-based optical metrology techniques. Unfortunately, typical imaging-based measurements lack sufficient signal information to directly measure complex three dimensional structures that are commonly manufactured today.

Image based measurements typically involve the recognition of specific target features (e.g., line segments, boxes, etc.) in an image and parameters of interest are calculated based on these features. Typically, the specialized target structures are specific to the image processing algorithm. For example, the line segments associated with an overlay target (e.g., box-in-box target, frame-in-frame target, advanced imaging metrology (AIM) target) are specifically designed to comply with the specifics of the algorithm. For this reason, traditional image based metrology algorithms cannot perform reliably with arbitrary targets or device structures.

Future metrology applications present challenges for image based metrology due to increasingly small resolution requirements and the increasingly high value of wafer area. Thus, methods and systems for improved image-based measurements are desired.

SUMMARY

Methods and systems for performing semiconductor measurements based on hyperspectral imaging are presented herein. A hyperspectral imaging system images a wafer over a large field of view with high pixel density over a broad range of wavelengths. Image signals collected from a measurement area are detected at a number of pixels. The detected image signals from each pixel are spectrally analyzed separately.

In some embodiments, the illumination and collection optics of a hyperspectral imaging system include only reflective optical elements.

In some embodiments, the illumination and collection optics of a hyperspectral imaging system include fiber optical elements to direct illumination light from the illumination source to the measurement area on the surface of the specimen under measurement and fiber optical elements to image the measurement area.

In a further aspect, some illumination fibers are p-polarized and others are s-polarized to introduce polarization sensitivity to the hyperspectral measurement.

In another further aspect, a fiber array collector includes a corresponding array of micro-lenses or micro-mirrors configured to control beam divergence and improve coupling efficiency. Each micro-lens of the array couples light into or out of an individual fiber optical element.

In another aspect, a fiber optics collector includes an image pixel mapper that couples a two dimensional array of collection fiber optical elements into a one dimensional array of pixels at the spectrometer and the hyperspectral detector. The one dimensional array of pixels is aligned in one direction across the active surface of the hyperspectral detector and the spectrometer disperses collected light according to wavelength in a direction orthogonal to the array of image pixels. In this manner, spatial information associated with the image of the measurement area collected over two dimensions is mapped to one dimension at the hyperspectral detector and wavelength information is captured in the orthogonal direction at the hyperspectral detector.

In another aspect, a hyperspectral imaging detector is configured as a time domain integration (TDI) detector that measures a spatial image of a specimen associated with a particular measurement area over different one or two dimensional arrays of pixels on different portions of the active surface of the hyperspectral TDI detector. Each pixel array is sensitive to different wavelength ranges, polarization states, or both. Furthermore, the measurements of a particular measurement area by each pixel array are integrated electronically to arrive at a spectral response of the spatial image.

The foregoing is a summary and thus contains, by necessity, simplifications, generalizations and omissions of detail;

consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing metrology of semiconductor structures based on hyperspectral imaging are presented herein. A hyperspectral imaging metrology system images a wafer over a large field of view with high pixel density over a broad range of wavelengths. In some embodiments, a hyperspectral imaging metrology system images a wafer over a field of view of at least 250 micrometers in one direction with high pixel density.

Illumination light reflected from a wafer surface over a large two-dimensional area is spatially imaged. Image signals collected from the imaged two-dimensional area are detected at a number of pixels. The detected image signals from each pixel are spectrally analyzed separately. In this manner, hyperspectral imaging enables process control of next generation semiconductor structures based on spectral analysis of image pixels associated with a large area image of a wafer under measurement.

Figure 1:
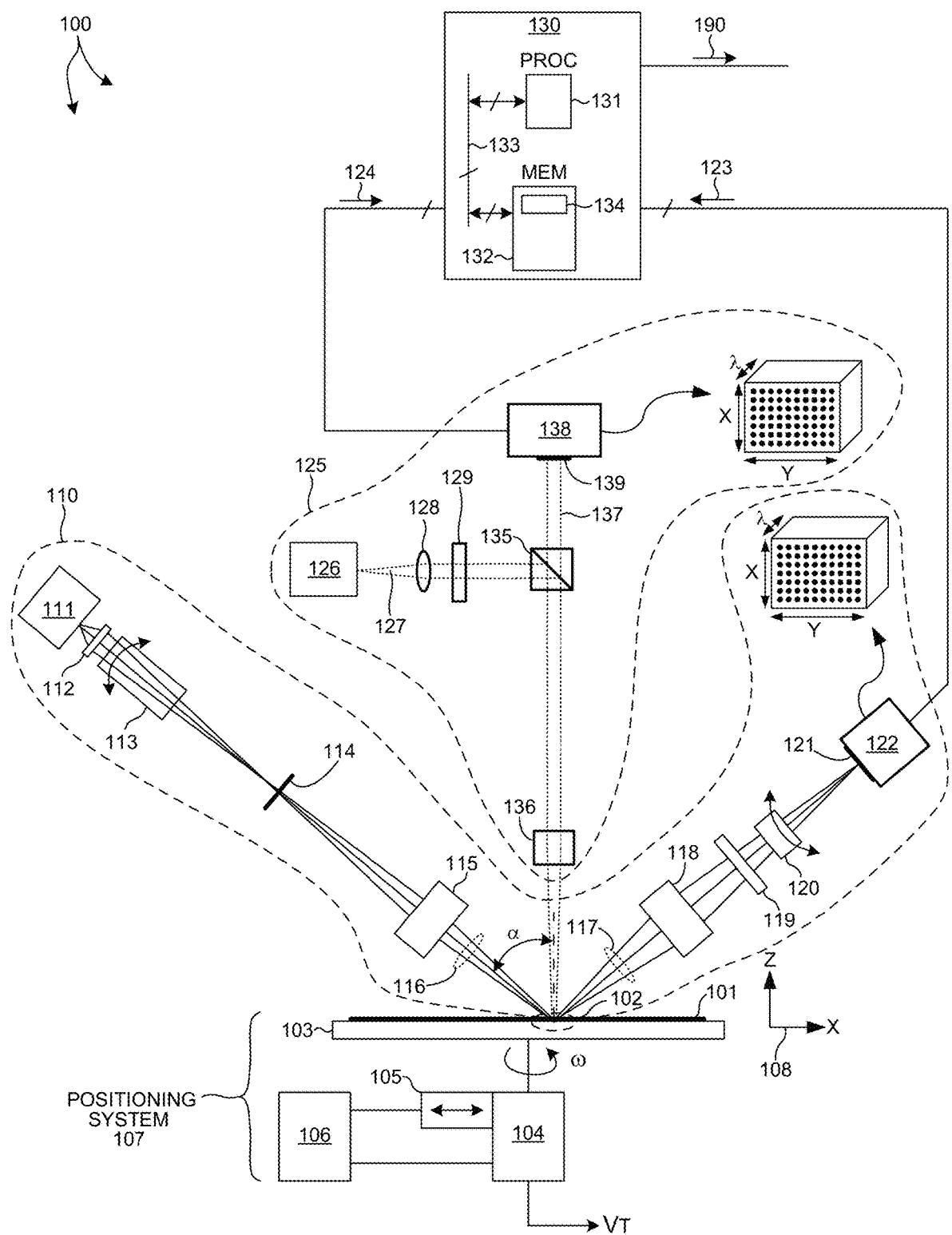
FIG. 1 is a diagram illustrative of an embodiment of a metrology system for measuring characteristics of a specimen including a hyperspectral imaging based ellipsometer in one embodiment and a hyperspectral imaging based reflectometer in one embodiment.

FIG. 1 illustrates an embodiment of a metrology system 100 for measuring characteristics of a specimen including two hyperspectral imaging based metrology tools: a hyperspectral imaging based ellipsometer 110 and a hyperspectral imaging based reflectometer 125. As depicted in FIG. 1, metrology system 100 may be used to perform optical measurements over a measurement area 102 of a specimen 101 disposed on a specimen positioning system 107.

As depicted in FIG. 1, hyperspectral imaging based ellipsometer 110 includes an illumination source 111 and illumination optical elements configured to receive light generated by illumination source 111 and direct illumination measurement beam 116 to a measurement area 102 of specimen 101 at an oblique angle of incidence, •, with respect to an axis normal to the surface of specimen 101. By way of non-limiting example, optical illumination source 111 includes one or more arc lamps, lasers, light emitting diodes, laser driven plasma sources, globars, laser driven supercontinuum sources, or any combination thereof. In general, any suitable optical illumination source or combination of sources may be contemplated. In some embodiments, optical illumination source 111 is configured to generate illumination light having wavelength components between 120 nanometers and 2500 nanometers. In some embodiments, optical illumination source 111 is configured to generate broadband illumination light including wavelengths ranging from 190 nanometers or less to 860 nanometers or more.

The illumination optical elements are configured to collimate or focus incident optical illumination beam 116 to measurement area 102 of specimen 101. In some embodiments, the illumination optical elements include one or more optical mirrors, focusing or defocusing optics (reflective or refractive), optical polarization components including polarizers and waveplates, optical apertures, optical monochromators, and optical beam stops, or any combination thereof.

Collection optical elements collect an amount of collected light scattered, reflected, diffracted or refracted from specimen 101 and image the collected light to spectrometer 121 and hyperspectral imaging detector 122. Together, the illumination measurement beam and collection measurement beam comprise the measurement beam of the measurement system (i.e., illumination measurement beam 116 and collection measurement beam 117 comprise the measurement beam of metrology system 100).

As depicted in FIG. 1, illumination light generated by illumination source 111 is focused by focusing optics 112 to a focal plane located at or near illumination slit 114. The illumination beam passes through rotating polarizer 113 (e.g., Rochon polarizer) and illumination slit 114. After passing through illumination slit 114, the polarized beam of illumination light 116 is focused by illumination objective 115 onto specimen 101. A portion 117 of the light reflected, refracted, diffracted, and scattered from the surface of specimen 101 is collected by a collection objective 118. Collected light 117 passes through retarder 119, rotating analyzer 120, spectrometer 121, and is incident on hyperspectral imaging detector 122. The collection objective 118 images the measurement area 102 on the surface of the semiconductor wafer to a field plane conjugate to the surface of the semiconductor wafer over a field of view having a dimension of at least 1 millimeter at the semiconductor wafer. The field plane is located at or near spectrometer 121 (e.g., a spectrometer slit or prism). In this manner, spectrometer 121 disperses the imaged measurement area at or near the field plane conjugate to the surface of the semiconductor wafer along one dimension according to wavelength. The dispersed light incident on hyperspectral imaging detector 122 simultaneously includes both spatial signal information (e.g., image information) and spectral information.

Hyperspectral imaging detector 122 detects a spectral response of the semiconductor wafer to the amount of broadband illumination light at each of a plurality of image pixels spanning the imaged measurement area. In this manner, hyperspectral imaging detector 122 generates output signals 123 indicative of a spectral response of the specimen to the incident illumination light at each image pixel over a large measurement area. In this manner, output signals 123 include an indication of the measured spectral response of the specimen based on one or more sampling processes implemented by the hyperspectral detector 122. Hyperspectral detector 122 is able to resolve one or more optical photon energies and produces signals for each optical energy component indicative of properties of the specimen. In some embodiments, hyperspectral detector 122 includes any of a CCD array, a photodiode array, a CMOS detector or a photomultiplier tube.

As depicted in FIG. 1, metrology system 100 also includes a hyperspectral imaging based reflectometer 125 also employed to perform optical measurements over measurement area 102 of specimen 101. As depicted in FIG. 1, hyperspectral imaging based reflectometer 125 includes an illumination source 126 that generates an amount of broadband illumination light 127 including a range of wavelengths. In some embodiments, illumination source 126 is a broadband illumination source such as an arc lamp (e.g., xenon lamp), a laser driven light source, a multiple wavelength laser, a supercontinuum laser, etc. In some other embodiments, illumination source 126 combines multiple narrowband light sources such as multiple single wavelength lasers, tunable narrowband lasers, etc. In some embodiments, illumination source 126 includes a combination of broadband and narrowband illumination sources. In some embodiments, illumination source 126 includes multiple light sources emitting light across the deep ultraviolet, ultraviolet, visible, near infrared, and infrared spectra. Multiple light sources may be combined by one or more sliding mirrors, beam splitters, or any other suitable configuration. In general, illumination source 126 may include any combination of light sources. In one example, illumination source 126 includes one or more light sources spanning a range of wavelengths between 120 nanometers and 2,500 nanometers. In some embodiments, optical illumination source 111 is configured to generate broadband illumination light including wavelengths ranging from 190 nanometers or less to 860 nanometers or more.

As depicted in FIG. 1, multiple wavelength illumination light 127 passes through collimation optics 128. Collimation optics 128 collimate the multiple wavelength illumination light 127. Collimation optics 128 includes lens components, mirror components, or a combination of both. In one embodiment, the multiple wavelength illumination light 127 is collimated by an off-axis parabolic mirror (OAP) and becomes a collimated circular beam. In some examples, the collimation optics 128 are configured to adjust the illumination NA.

As depicted in FIG. 1, the multiple wavelength illumination light collimated by collimation optics 128 passes through one or more color filters 129. Color filters 129 select one or more illumination wavelength(s) and corresponding wavelength range(s) for measurement purposes, and absorb, or otherwise dissipate unwanted wavelengths. The one or more color filters 129 may include one or more optical filters, one or more color filter wheels, one or more linear varying edge filters, etc. The one or more color filters 129 may include one or more long pass filters, low pass filters, band-pass filters, etc. In general, it is advantageous to select one or more wavelength ranges appropriate to a given measurement application, measurement instance, or both.

Although, as depicted in FIG. 1, reflectometer 125 includes one or more color filters 129, in some other embodiments, color filters may not be employed. Thus, in general, the use of color filters is optional.

As depicted in FIG. 1, multiple wavelength illumination light 127 is directed to illumination beam splitter 135. Illumination beam splitter 135 may include any suitable beam splitting element including, but not limited to, a cubic beam splitter, a metallic coating plate, a dichroic optical coating plate, half mirror, or other beam splitting/combining mechanism. Beam splitter 135 directs illumination light to objective 136. Objective 136 directs illumination light 127 to the surface of specimen 101 over measurement area 102. Light reflected, diffracted, and scattered from the surface of specimen 101 is collected by objective 136.

In a preferred embodiment, objective 136 includes only reflective optical surfaces to accommodate the range of wavelengths potentially employed by the hyperspectral imaging systems described herein. In some examples, a reflaxicon objective is employed. Such an objective is capable of high NA (e.g., NA>0.9). For hyperspectral imaging measurements performed at normal angles of incidence at the wafer (e.g., measurements performed by reflectometer 125), the same objective optical elements may be employed to control the illumination of specimen 101 and collection of light from specimen 101.

Objective 136 images the measurement area 102 on the surface of the semiconductor wafer to a field plane conjugate to the surface of the semiconductor wafer over a field of view having a dimension of at least 250 micrometers at the semiconductor wafer. The field plane is located at or near spectrometer 139 (e.g., a spectrometer slit or prism). In this manner, spectrometer 139 disperses the imaged measurement area at or near the field plane conjugate to the surface of the semiconductor wafer along one dimension according to wavelength. The dispersed light incident on hyperspectral imaging detector 138 simultaneously includes both spatial signal information (e.g., image information) and spectral information.

Hyperspectral imaging detector 138 detects a spectral response of the semiconductor wafer to the amount of broadband illumination light at each of a plurality of image pixels spanning the imaged measurement area. In this manner, hyperspectral imaging detector 138 generates output signals 124 indicative of a spectral response of the specimen to the incident illumination light at each image pixel over a large measurement area. In this manner, output signals 124 include an indication of the measured spectral response of the specimen based on one or more sampling processes implemented by the hyperspectral detector 138.

Hyperspectral detector 138 is able to resolve one or more optical photon energies and produces signals for each optical energy component indicative of properties of the specimen. In some embodiments, hyperspectral detector 138 includes any of a CCD array, a photodiode array, a CMOS detector or a photomultiplier tube.

In some embodiments, spectrometers 121 and 139 include a reflective grating, which is preferable for wide wavelength ranges. The grating density is selected to achieve the wavelength resolution for the measurement application. For example, if high wavelength resolution in the ultraviolet spectrum is required, a high density reflective grating or a prism is preferred. In general, a wavelength dispersive element of spectrometers 121 and 139 may include at least one curved diffraction grating, planar diffraction grating, holographic plate, prism, or any other element suitable for spatially dispersing the collected light according to wavelength.

In some embodiments, detectors 122 and 138 include a two dimensional charge coupled device (2D-CCD). In some other embodiments, detectors 122 and 138 include a two or three dimensional complementary metal oxide semiconductor (CMOS) sensor. In general, detectors 122 and 138 may be any detector having separately addressable pixels, or other optically sensitive elements, arrayed in two or three dimensions. In this manner, both two dimensional spatial information and wavelength information are resolved by ellipsometer 110 and reflectometer 125.

In some embodiments, hyperspectral imaging detectors 122 and 138 are configured to measure wavelength components by penetration depth (vertical detector), index of refraction, or another wavelength dependent property of the detector. In some embodiments, a CMOS hyperspectral detector images the measurement area 102 of specimen 101 in two dimensions (e.g., X and Y dimensions of coordinate system 108) and resolves wavelength information in a third dimension orthogonal to the two planar dimensions (e.g., depth into the detector). In some other embodiments, each "pixel" on the face of the hyperspectral detector is a spectrometer including a small grating structure that spreads the incoming light onto a number of different light sensitive elements.

FIG. 1 depicts an illustrative view of illumination and collection optics of a hyperspectral imaging based reflectometer and ellipsometer. However, in general, the optical subsystems may include any type and arrangement of optical filter(s), field stops, aperture stops, polarizers, analyzers, waveplates, fibers, etc., known in the art of spectroscopic reflectometry and ellipsometry.

In some embodiments, illumination of a measurement area by a hyperspectral imaging system over a measurement period includes a broad range of wavelengths simultaneously incident on the measurement area over the measurement period. In these embodiments, spectral analysis of the illuminated area occurs over the broad range of wavelengths for the entire measurement period. In other embodiments, illumination of a measurement area by a hyperspectral imaging system over a measurement period includes a sequence of narrow ranges of wavelengths sequentially incident on the measurement area over the measurement period. In these embodiments, spectral analysis of the illuminated area occurs sequentially over each narrow range of wavelengths. In some embodiments, a rotating color wheel is located in the illumination path of a hyperspectral imaging system to sequentially illuminate the measurement area with different, narrow ranges of illumination wavelengths.

As illustrated in FIG. 1, metrology tool 100 includes a specimen positioning system 107 configured to move specimen 101 with respect to the optical elements of metrology tool 100. In some embodiments, computing system 130 communicates command signals (not shown) to motion controller 106 of specimen positioning system 107 that indicate the desired position of specimen 101. In response, motion controller 106 generates command signals to the various actuators of specimen positioning system 107 to achieve the desired positioning of specimen 101.

In the embodiment depicted in FIG. 1, specimen positioning system 107 includes a wafer chuck 103, motion controller 106, a rotation stage 104 and a translation stage 105, and a z-stage (not shown). Rotation stage 104 and translation stage 105 are configured to translate specimen 101 in two dimensions within the x-y plane depicted by coordinate system 108. The z-stage is configured to translate specimen 101 in the z-direction depicted by coordinate system 108. Specimen 101 is supported on wafer chuck 103. In some embodiments, specimen 101 is located with its geometric center approximately aligned with the axis of rotation of rotation stage 104. In this manner, rotation stage 104 spins specimen 101 about its geometric center at a specified angular velocity, $\omega$, within an acceptable tolerance. In addition, translation stage 105 translates the specimen 101 in a direction approximately perpendicular to the axis of rotation of rotation stage 104 at a specified velocity, VT. Motion controller 106 coordinates the spinning of specimen 101 by rotation stage 104 and the translation of specimen 101 by translation stage 105 to achieve the desired scanning motion of specimen 101 within system 100. In some other embodiments, specimen positioning system 107 combines two orthogonal, large stroke, translational movements (e.g., movements in the X and Y directions) to position specimen 101 with respect to the hyperspectral imaging based ellipsometer 110 and reflectometer 125.

Metrology system 100 also includes a computing system 130 employed to acquire signals 123 and 124 generated by hyperspectral imaging detectors 122 and 138, respectively, and estimate values 190 of one or more parameters of interest describing structural properties of the specimen based at least in part on the acquired hyperspectral imaging signals. In some embodiments, computing system 130 is configured to access model parameters in real-time, employing Real Time Critical Dimensioning (RTCD), or it may access libraries of pre-computed models for determining a value of at least one specimen parameter value associated with the specimen 101.

In some examples, the measurement models are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In some embodiments, transformation of hyperspectral image signals into estimated values of wafer parameters of interest is achieved with a variety of computational methods, including model-based least squares fitting or maximum likelihood estimation, as well as machine learning algorithms trained during recipe creation using single or multiple chamber measurements, and supplemented by synthetic spectra covering larger process windows and wider ranges of system optical variability.

In some embodiments, computing system 130 is configured to determine properties of the specimen without reference to a physically based reference model, e.g., signal response model based CD measurements or overlay measurements. In some of these embodiments, computing system 130 analyzes each hyperspectral image as a whole. Instead of recognizing individual features in the hyperspectral image, each pixel is considered as an individual signal containing information about (or sensitive to) structural parameters, process parameters, dispersion parameters, etc. In these embodiments, the high information content present in measured hyperspectral images is transformed into estimated values of structural parameters of interest.

A hyperspectral image-based signal response metrology (SRM) model is trained based on measured, hyperspectral image-based training data (e.g., hyperspectral images collected from a Design of Experiments (DOE) wafer) and corresponding reference measurement data (e.g., measurements of parameters of interest such as CD, overlay, etc. The trained, hyperspectral image-based measurement model is then used to calculate values of one or more parameters of interest directly from measured hyperspectral image data collected from other wafers. The trained, hyperspectral image-based SRM models described herein receive hyperspectral image data directly as input and provide estimates of values of one or more parameters of interest as output. By streamlining the measurement process, the predictive results are improved along with a reduction in computation and user time.

By using only raw hyperspectral image data to create the hyperspectral image-based measurement model, as described herein, the errors and approximations associated with traditional image based metrology methods are reduced. In addition, the hyperspectral image-based measurement model is not sensitive to systematic errors, asymmetries, etc. because the hyperspectral image-based measurement model is trained based on hyperspectral image data collected from a particular metrology system and used to perform measurements based on hyperspectral images collected from the same metrology system.

In some embodiments, the hyperspectral image-based measurement model is implemented as a neural network model. In one example, the number of nodes of the neural network is selected based on features extracted from the hyperspectral image data. In other examples, the hyperspectral image-based SRM model may be implemented as a linear model, a polynomial model, a response surface model, a support vector machines model, or other types of models. In some examples, the hyperspectral image-based measurement model may be implemented as a combination of models. In some examples, the selected model is trained based on the reduced set of signals determined from a feature extraction model (e.g., features extracted by a principal component analysis of the raw, hyperspectral image data) and the measured reference values of the parameter(s) of interest. The model is trained such that its output fits the measured reference values of the parameter(s) of interest for all the images in the parameter variation space defined by the DOE images.

In general, measurement models associated with critical dimensions (CD), thin film thickness, overlay, pitchwalk, focus/dose, and composition measurements may be applied by computing system 130 to resolve specimen parameter values, by way of non-limiting example.

In general, metrology system 100 images specimen 101 over a large area. When measurements are performed at normal incidence, the measurement area may extend over large distances in both planar directions at the surface of the specimen under measurement. For example, hyperspectral reflectometer 125 performs hyperspectral measurements at normal incidence. In some examples, hyperspectral reflectometer 125 is configured to simultaneously illuminate the entire wafer, e.g., illumination area that extends 300 millimeters in the x-direction and 300 millimeters in the y-direction. In some examples, hyperspectral reflectometer 125 is configured to simultaneously illuminate a field of view having a dimension of at least one millimeter in one direction. In some examples, hyperspectral reflectometer 125 is configured to simultaneously illuminate a field of view having a dimension of at least 10 millimeters in one direction.

However, when measurements are performed at oblique incidence, the measurement area may extend over a large distance in one direction and a relatively short distance in an orthogonal direction at the surface of the specimen under measurement. More specifically, the measurement area extends over a relatively short distance along a direction aligned with the plane of incidence (i.e., the plane formed by illumination 116 and the normal to the surface of specimen 101), and extends over a relatively large distance along a direction orthogonal to the plane of incidence. For example, hyperspectral ellipsometer 110 performs hyperspectral measurements at oblique incidence. In some examples, hyperspectral ellipsometer 110 is configured to illuminate a measurement area that extends 250 micrometers or more in the y-direction and 50 micrometers or less in the x-direction. In some examples, hyperspectral ellipsometer 110 is configured to illuminate a measurement area that extends 1 millimeter or more in the y-direction and 50 micrometers or less in the x-direction. In some examples, hyperspectral ellipsometer 110 is configured to illuminate a measurement area that extends 10 millimeters or more in the y-direction and 50 micrometers or less in the x-direction. In some examples, hyperspectral ellipsometer 110 is configured to illuminate a measurement area that extends 300 millimeters or more in the y-direction and 50 micrometers or less in the x-direction. By maintaining a measurement area that extends over a relatively short distance along a direction aligned with the plane of incidence, beam focusing errors are reduced.

In some embodiments, objective 115 includes a pair of cylindrical mirrors is employed to shape the illumination beam to a line shape. In other embodiments, a cylindrical lens, a spatial light modulator (SLM), a diffractive optical element, a slit, or group of slits, two or more deformable mirrors, or other suitable elements are employed to shape the beam to a line shape.

In some embodiments, multiple objectives are located on a movable stage (e.g., motorized objective turret or motorized linear objective changer). In this manner, the selection of a particular objective may be programmably controlled, for example, by computing system 130. In this manner, different objectives may be made available to provide the best wavelength range and NA range for different measurement applications.

In another aspect, the measurement area 102 of specimen 101 imaged by metrology system 100 is moved over different areas of specimen 101. In some embodiments, specimen 101 is moved with respect to the optical metrology system. In some embodiments, the field of view of the optical metrology system is moved with respect to specimen 101. In some embodiments, specimen 101 is moved with respect to the optical metrology system and the field of view of the optical metrology system is moved with respect to specimen 101. Furthermore, the shape and dimension of the imaged measurement area 102 are selected to measure any suitable large area at a given instance.

Figure 2:
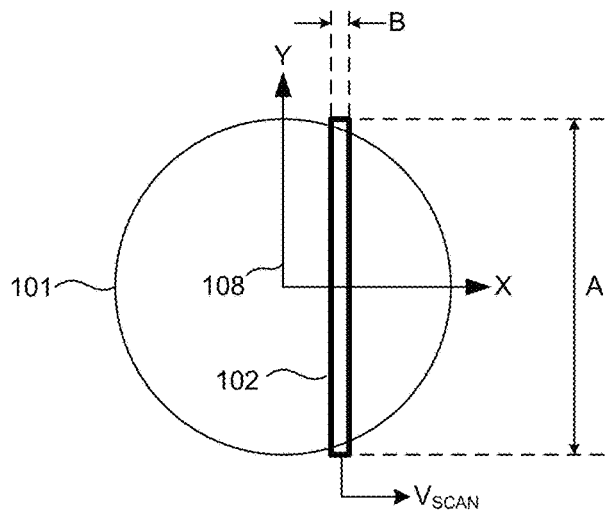
FIG. 2 is a diagram illustrative of one example of a measurement area of a semiconductor wafer under measurement.
Figure 3:
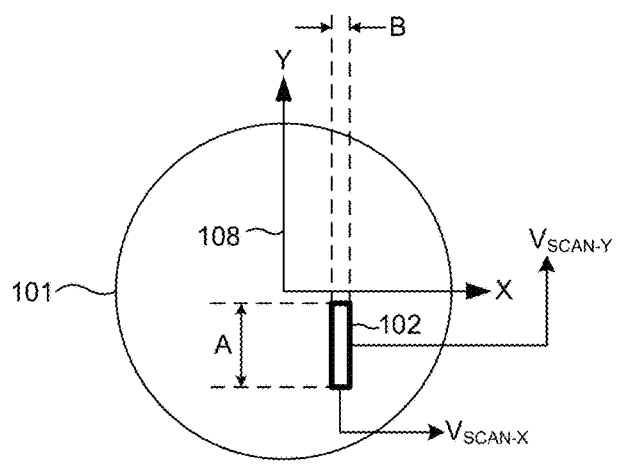
FIG. 3 is a diagram illustrative of another example of a measurement area of a semiconductor wafer under measurement.
Figure 4:
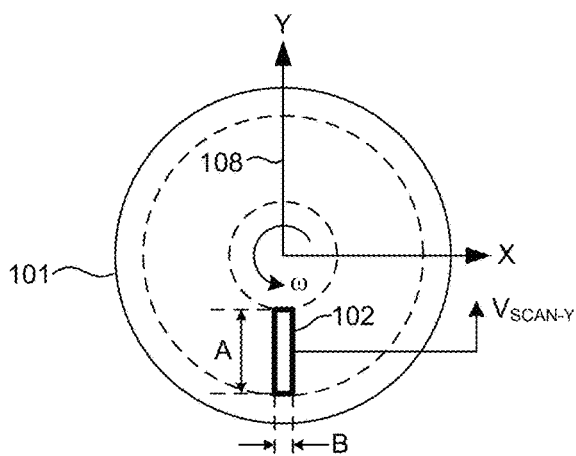
FIG. 4 is a diagram illustrative of yet another example of a measurement area of a semiconductor wafer under measurement.

FIGS. 2-4 depict illustrations of an imaged measurement area 102 of a portion of specimen 101. The imaged area 102 has a dimension, A, in the X-direction, and a dimension, B, in the Y-direction. In general, dimensions A and B may be any suitable dimensions to image a large area of specimen 101 at any given instance. In general, the pixel density associated with the measurement area 102 is relatively high (e.g., one million pixels). Imaged measurement area 102 is subdivided into many pixels in the Y-direction. In some embodiments, imaged measurement area 102 is also subdivided into many pixels in the X-direction. However, in some embodiments, imaged measurement area 102 includes only one pixel in the X-direction.

As depicted in FIG. 2, A is long enough to image the entire wafer in the Y-direction at a given instance (e.g., 300 millimeters or greater). However, B is relatively short (e.g., 30 micrometers). In the embodiment depicted in FIG. 2, imaged measurement area 102 is stepped or scanned over specimen 101 in the X-direction. This is achieved by moving elements of the optical system to step or scan the field of view over specimen 101 in the X-direction at velocity, Vscan. Alternatively, specimen positioning system 107 is employed to step or scan specimen 101 in the X-direction relative to the optical system.

As depicted in FIG. 3, A is relatively long and images a significant portion of the entire wafer in the Y-direction at a given instance (e.g., 10 millimeters or greater). However, B is relatively short (e.g., 30 micrometers). In the embodiment depicted in FIG. 3, imaged measurement area 102 is stepped or scanned over specimen 101 in the X-direction at velocity, Vscan-x, and the Y-direction at velocity, Vscan-y. This is achieved by moving elements of the optical system to step or scan the field of view over specimen 101 in the X-direction at velocity, Vscan-x, and Y-direction at velocity, Vscan-y. Alternatively, specimen positioning system 107 is employed to step or scan specimen 101 in the X-direction at velocity, Vscan-x and Y-direction at velocity, Vscan-y, relative to the optical system.

As depicted in FIG. 4, A is relatively long and images a significant portion of the entire wafer in the Y-direction at a given instance (e.g., 10 millimeters or greater). However, B is relatively short (e.g., 30 micrometers). In the embodiment depicted in FIG. 4, specimen positioning system 107 is employed to rotate specimen 101 about a rotational axis aligned with the Z-direction (i.e., perpendicular to the X-Y plane) in a stepwise or scanning motion at angular velocity, *. In addition, imaged measurement area 102 is stepped or scanned over specimen 101 in the Y-direction at velocity, Vscan-y. This is achieved by moving elements of the optical system to step or scan the field of view over specimen 101 in the Y-direction. Alternatively, specimen positioning system 107 is employed to step or scan specimen 101 in the Y-direction at velocity, Vscan-y, relative to the optical system. In this manner, imaged measurement area 102 is moved over any suitable portion of specimen 101.

In some embodiments, a piezo driven mirror is located in the illumination path to move a line shaped beam along the sample surface in one direction. In some embodiments, two or more piezo driven mirrors are located in the illumination path to move a line shaped beam along the sample surface in two directions (e.g., X-direction and Y-direction).

In a further aspect, the illumination and collection optics of a hyperspectral imaging system, such as hyperspectral imaging ellipsometer 110 and hyperspectral imaging reflectometer 125 include only reflective optical elements, and not refractive optical elements.

Figure 5:
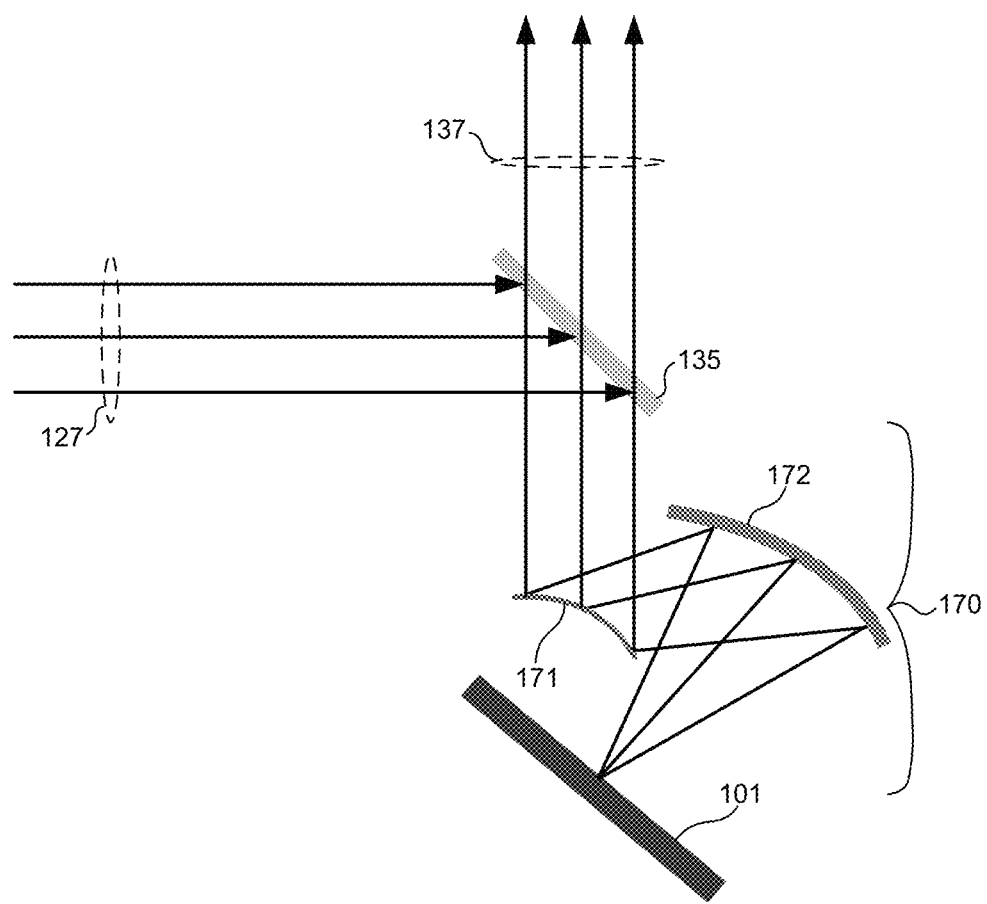
FIG. 5 is a diagram illustrative of optical elements of a hyperspectral reflectometer including a wide angle, off axis reflective objective in one embodiment.

In some embodiments, a hyperspectral imaging system includes a wide angle, off axis reflective objective. FIG. 5 depicts optical elements of a hyperspectral reflectometer (e.g., hyperspectral reflectometer 125) including a wide angle, off axis reflective objective 170 in one embodiment. In the embodiment depicted in FIG. 5, the hyperspectral reflectometer includes wide angle, unobscured, off axis reflective objective 170 to achieve oblique incidence. Incoming light 127 reflects off convex mirror 171 toward concave mirror 172. The reflected light is focused on the surface of wafer 101 by concave mirror 172. The illumination light 127 is focused onto the surface of wafer 101 over a range of angles of incidence by objective 170. In some examples, illumination light 127 is focused onto the surface of wafer 101 within a range of angles of incidence between 5 and 40 degrees. In some other examples, illumination light 127 is focused onto the surface of wafer 101 within a range of angles of incidence between 5 and 25 degrees. In some examples, a portion of illumination light 127 is focused onto the surface of wafer 101 at an angle of incidence less than 20 degrees. A portion 137 of the light reflected, refracted, diffracted, and scattered from the surface of specimen 101 is collected by objective 170 and directed toward a hyperspectral imaging detector as described with reference to FIG. 1.

The wide angle, off axis reflective objective depicted in FIG. 5 is provided by way of example. In general, other objectives employing only reflective optical elements may be employed (e.g., a Schwartzchild objective, etc.).

In some embodiments, the illumination and collection optics of a hyperspectral imaging system, such as hyperspectral imaging ellipsometer 110 and hyperspectral imaging reflectometer 125 include one or more aspheric mirrors, one or more free form mirrors, or a combination thereof.

Although, in some embodiments, the illumination and collection optics of a hyperspectral imaging system include only reflective optical elements, in general, the illumination and collection optics of a hyperspectral imaging system may be catoptric (i.e., all reflective surfaces), catadioptric (i.e., combination of both reflective and refractive surfaces), or dioptric (i.e., all refractive surfaces).

In another aspect, the illumination and collection optics of a hyperspectral imaging system, such as hyperspectral imaging ellipsometer 110 and hyperspectral imaging reflectometer 125 include fiber optical elements to direct illumination light from the illumination source to the measurement area on the surface of the specimen under measurement and fiber optical elements to image the measurement area.

Figure 6:
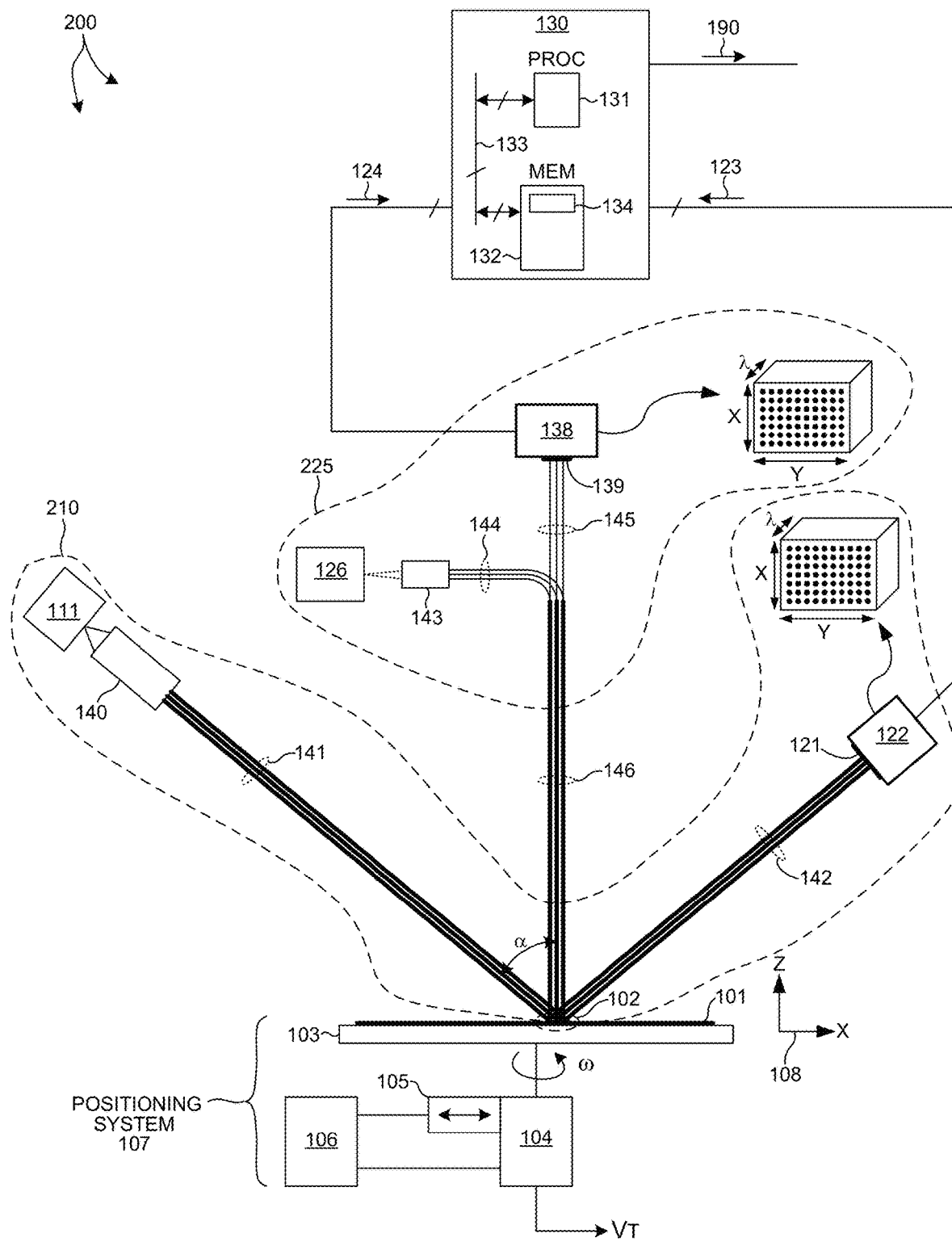
FIG. 6 is a diagram illustrative of another embodiment of a metrology system for measuring characteristics of a specimen including a hyperspectral imaging based ellipsometer in another embodiment and a hyperspectral imaging based reflectometer in another embodiment.

FIG. 6 depicts a metrology system 200 including a hyperspectral ellipsometer 210 and a hyperspectral reflectometer 225 in one embodiment. Like numbered elements illustrated in FIG. 6 are analogous to those described with reference to FIG. 1.

As depicted in FIG. 6, hyperspectral ellipsometer 210 includes a fiber optics array illuminator and a fiber optics array collector. In the embodiment depicted in FIG. 6, the fiber optics array illuminator includes a light pipe 140 and a bundle of illumination fiber optical elements 141 that direct illumination light from illumination source 111 to specimen 101. The fiber optics array collector includes a bundle of collection fiber optical elements 142 that collect light from the measurement area 102 and directs the collected light to spectrometer 121 and hyperspectral detector 122.

Also, as depicted in FIG. 6, hyperspectral reflectometer 225 includes a combined fiber optics array illuminator and fiber optics array collector 146. In the embodiment depicted in FIG. 6, the combined fiber optics illuminator/collector 146 includes a bundle of illumination fiber optical elements 144 that collects illumination light from light pipe 143 and directs the illumination light to specimen 101, and a bundle of collection fiber optical elements 145 that collects light from the measurement area 102 and directs the collected light to spectrometer 139 and hyperspectral detector 138.

As depicted in FIG. 6, the same fiber optical elements may be employed as the fiber array illuminator and collector when hyperspectral measurements of specimen are performed at normal incidence. In some embodiments, some of the fibers in the combined fiber array are used for illumination, and others for collection. In some other embodiments, the same fibers in the combined fiber array are used for illumination and collection by temporal separation.

Conversely, a fiber optic illuminator separate from the fiber optic collector is employed when hyperspectral measurements of specimen are performed at oblique incidence. Moreover, it is preferable to configure the fiber optic illuminator and fiber optic collector of an oblique incidence, hyperspectral imaging system such that the measurement area extends over a relatively short distance along a direction aligned with the plane of incidence and a relatively large distance along a direction orthogonal to the plane of incidence to minimize focus errors as described hereinbefore.

In a further aspect, some illumination fibers are p-polarized and others are s-polarized to introduce polarization sensitivity to the hyperspectral measurement.

In a further aspect, a fiber array collector includes a corresponding array of micro-lenses or micro-mirrors configured to control beam divergence and improve coupling efficiency. Each micro-lens of the array couples light into or out of an individual fiber optical element.

Figure 7:
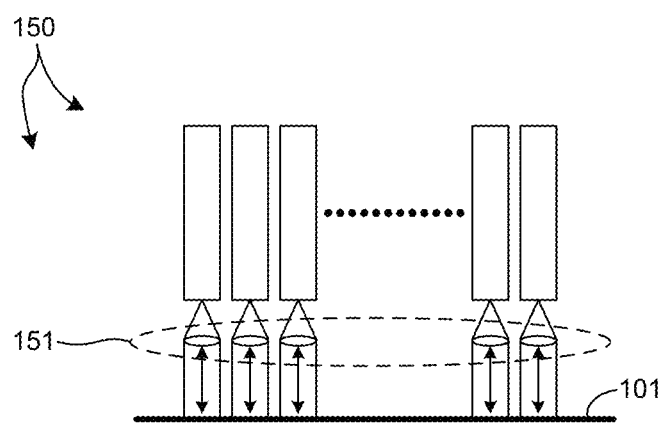
FIG. 7 is a diagram illustrative of a combined fiber optics illuminator/collector including an array of micro-lenses in one embodiment.

FIG. 7 depicts an embodiment 150 of a combined fiber optics illuminator/collector including an array of micro-lenses 151. In the embodiment depicted in FIG. 7, each fiber is employed as an illuminator and a collector. Furthermore, as depicted in FIG. 7, each micro-lens of the array of micro-lenses 151 is configured to collimate illumination light provided to specimen 101.

Figure 8:
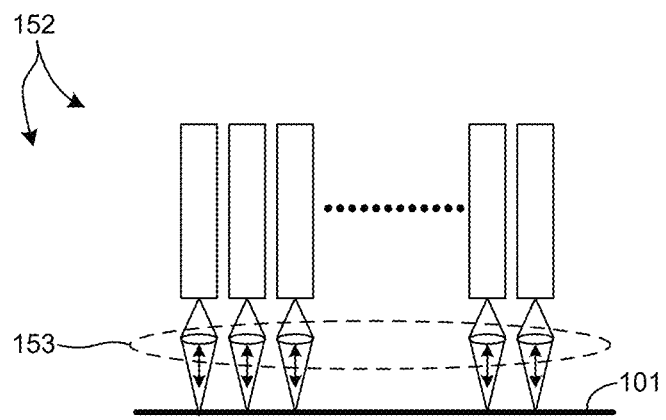
FIG. 8 is a diagram illustrative of a combined fiber optics illuminator/collector including an array of micro-lenses in another embodiment.

FIG. 8 depicts an embodiment 152 of a combined fiber optics illuminator/collector including an array of micro-lenses 153. In the embodiment depicted in FIG. 8, each fiber is employed as an illuminator and a collector. Furthermore, as depicted in FIG. 8, each micro-lens of the array of micro-lenses 153 is configured to focus illumination light provided to specimen 101.

Figure 9:
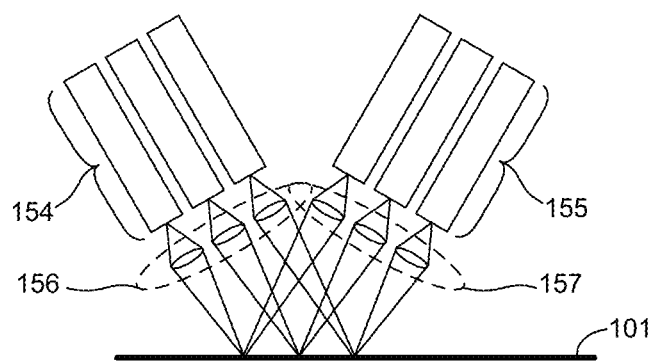
FIG. 9 is a diagram illustrative of a fiber optics illuminator and a fiber optics collector suitable for oblique incidence measurements.

FIG. 9 depicts a fiber optics illuminator 154 including a plurality of illumination fiber optical elements and a fiber optics collector 155 including a plurality of collection fiber optical elements. The configuration depicted in FIG. 9 is suitable for oblique incidence measurements. As depicted in FIG. 9, an array of micro-lenses 156 focuses illumination light provided to specimen 101, and an array of micro-lenses 157 collects light from specimen 101 in response to the illumination light. In another embodiment (not shown), the array of micro-lenses 156 is configured to collimate illumination light provided to specimen 101, and the array of micro-lenses 157 collects light from specimen 101 in response to the collimated illumination light.

Figure 10:
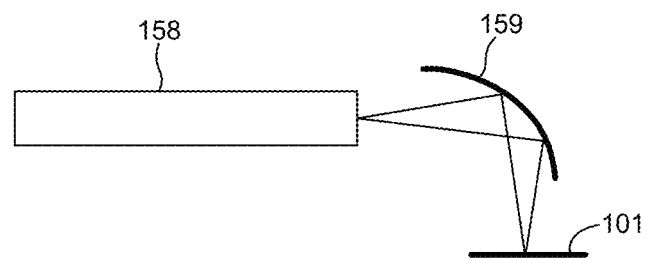
FIG. 10 is a diagram illustrative of a combined illuminator/collector fiber optical element and a corresponding micro-mirror in one embodiment.

FIG. 10 depicts a combined illuminator/collector fiber optical element 158 and a corresponding micro-mirror 159. Fiber optical element 158 is one of an array of combined illuminator/collector fiber optical elements. Fiber optical element 158 is employed as an illuminator and a collector. Furthermore, as depicted in FIG. 10, micro-mirror element 159 is configured to focus illumination light provided to specimen 101 and collect light from specimen 101 in response to the illumination and couple the collected light into fiber optical element 158.

Figure 11:
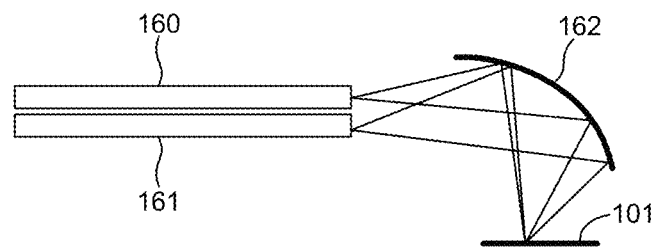
FIG. 11 is a diagram illustrative of an illuminator fiber optical element, a collector fiber optical element, and a corresponding micro-mirror in one embodiment.

FIG. 11 depicts an illuminator fiber optical element 160, a collector fiber optical element 161, and a corresponding micro-mirror 162. Fiber optical element 160 is one of an array of illuminator fiber optical elements and fiber optical element 161 is one of an array of collector fiber optical elements. Furthermore, as depicted in FIG. 10, micro-mirror element 159 is configured to focus illumination light from fiber optical element 160 to specimen 101 and collect light from specimen 101 in response to the illumination and couple the collected light into fiber optical element 161.

In another aspect, an optical switch is employed to couple several collection fiber optical elements into one spectrometer in a temporally sequential manner.

In another aspect, the fiber optics collector includes an image pixel mapper that couples a two dimensional array of collection fiber optical elements into a one dimensional array of pixels at the spectrometer and the hyperspectral detector. The one dimensional array of pixels is aligned in one direction across the active surface of the hyperspectral detector and the spectrometer disperses collected light according to wavelength in a direction orthogonal to the array of image pixels. In this manner, spatial information associated with the image of the measurement area collected over two dimensions is mapped to one dimension at the hyperspectral detector and wavelength information is captured in the orthogonal direction at the hyperspectral detector. In this manner, a two dimensional detector (e.g., a two dimensional CCD or CMOS detector) is employed as a hyperspectral detector.

Figure 12:
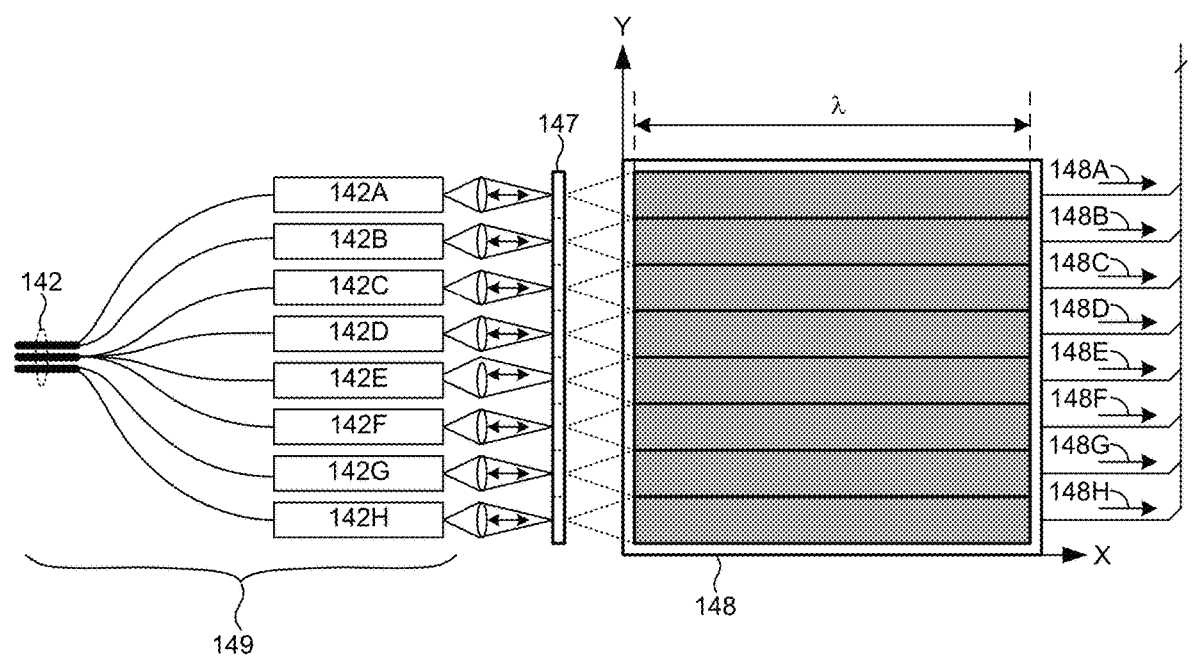
FIG. 12 is a diagram illustrative of a hyperspectral imaging system including an image pixel mapper in one embodiment.

FIG. 12 depicts a hyperspectral imaging system including an image pixel mapper 149. As depicted in FIG. 12, a bundle of collection fiber optical elements 142 images a two dimensional measurement area 102 and directs the collected light to image pixel mapper 149. The bundle of collection fiber optical elements 142 are arranged as a two dimensional bundle of fiber optical elements. Image pixel mapper 149 reconfigures the two dimensional bundle of fiber optical elements into a one dimensional array of fiber optical elements 142A-H aligned with the Y-direction of hyperspectral detector 148. In the embodiment depicted in FIG. 12, each of the fiber optical elements 142A-H is coupled to spectrometer 147 by a micro-lens. However, in general, a micro-lens array is optional. Spectrometer 147 receives the collected light from each of the fiber optical elements 142A-H and disperses the collected light according to wavelength across the active surface of hyperspectral detector 148 in the X-direction. In this manner spectrometer 147 is configured to disperse light from a spatially distinct area of a field image conjugate to the surface of the wafer in a direction perpendicular to the one dimensional array of image pixels. In this manner, spectrometer 147 performs a spectral analysis of light collected from many spatially distinct areas of the measurement spot. Signals (e.g., signals 148A-H) associated with each unique spectrum measured at each image pixel are communicated from the hyperspectral detector 148 to computing system 130.

In some embodiments, the fiber optics collector captures light from specimen 101 along a one dimensional array of image pixels. In these embodiments, the one dimensional array of pixels is directly coupled into the spectrometer and the hyperspectral detector without the use of an image pixel mapper. As described hereinbefore, the one dimensional array of pixels is aligned in one direction across the active surface of the hyperspectral detector and the spectrometer disperses collected light according to wavelength in a direction orthogonal to the array of image pixels. In this manner, spatial information associated with the image of the measurement area collected over two dimensions is mapped to one dimension at the hyperspectral detector and wavelength information is captured in the orthogonal direction at the hyperspectral detector. In this manner, a two dimensional detector (e.g., a two dimensional CCD or CMOS detector) is employed as a hyperspectral detector. In these embodiments, the image measurement area at a given instance is subdivided into a one dimensional array of pixels. Two dimensional image information is obtained sequentially by scanning the one dimensional array of pixels relative to the wafer as described hereinbefore. In this manner, two dimensional hyperspectral image information is obtained as a composite of many one dimensional hyperspectral images.

In another aspect, a hyperspectral imaging detector is configured as a time domain integration (TDI) detector that measures a spatial image of a specimen associated with a particular measurement area over different one (line image) or two dimensional (area image) arrays of pixels on different portions of the active surface of the hyperspectral TDI detector. Each pixel array is sensitive to different wavelength ranges, polarization states, or both. Furthermore, the measurements of a particular measurement area by each pixel array are integrated electronically to arrive at a spectral response of the spatial image.

In some embodiments, the active surface of a hyperspectral TDI detector is subdivided into different zones, each sensitive to a different range of wavelengths, different polarization state, or both. A one or two dimensional image of the measurement area is scanned over the active surface of the hyperspectral TDI detector and the one or two dimensional image is resolved according to wavelength, polarization state, or both, at each zone of the hyperspectral TDI detector.

Figure 13A:
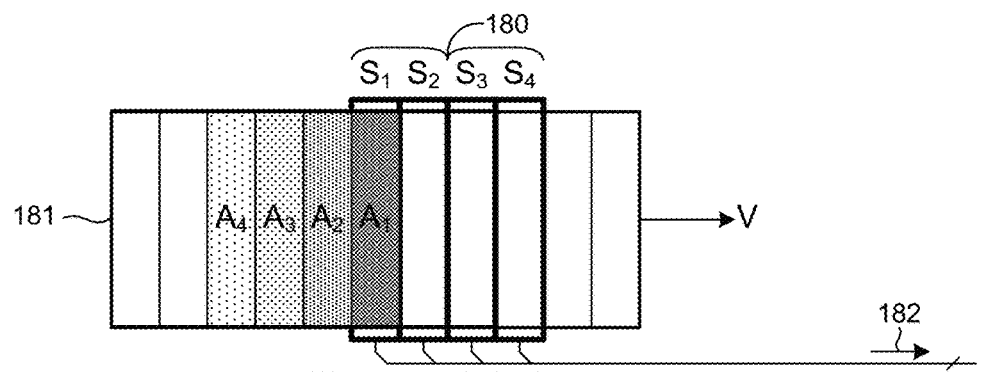
FIGS. 13A-D depict a hyperspectral TDI detector including an active surface subdivided into four zones, $S_1$-$S_4$, each sensitive to a different wavelength range, polarization state, or both.
Figure 13B:
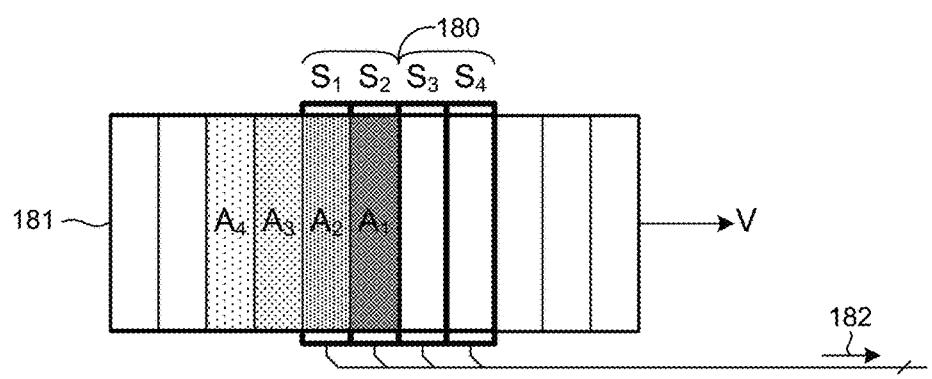
Figure 13C:
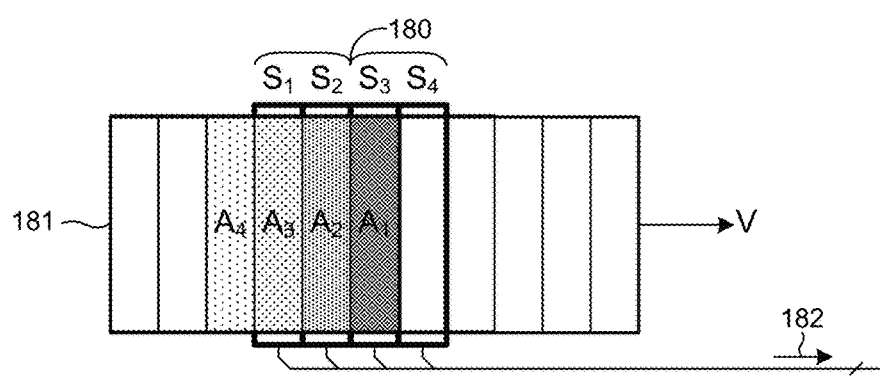
Figure 13D:
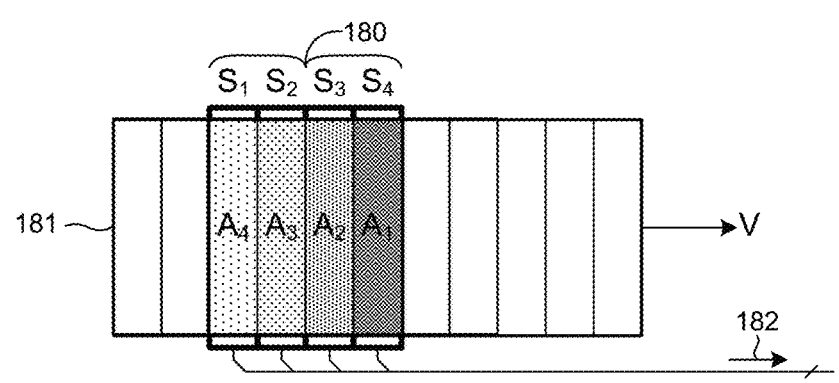

FIGS. 13A-D depict a hyperspectral TDI detector 180 including an active surface subdivided into four zones, $S_1$-$S_4$, each sensitive to a different wavelength range, polarization state, or both. For explanatory purposes, image window 181 is an image of a portion of specimen 101 scanned over the field of view of hyperspectral TDI detector 180 at velocity, V. As depicted in FIG. 13A, an image, $A_1$, of a particular portion of specimen 101 is scanned over zone $S_1$ of detector 180 at time, $T_1$. As depicted in FIG. 13B, image, $A_1$, of the particular portion of specimen 101 is scanned over zone $S_2$ of detector 180, and image $A_2$, of an adjacent portion of specimen 101 is scanned over zone $S_1$ of detector 180 at time, $T_2$. As depicted in FIG. 13C, image, $A_1$, of the particular portion of specimen 101 is scanned over zone $S_3$ of detector 180, image $A_2$, of an adjacent portion of specimen 101 is scanned over zone $S_2$ of detector 180, and image $A_3$, of another adjacent portion of specimen 101 is scanned over zone $S_1$ of detector 180 at time, $T_3$. As depicted in FIG. 13D, image, $A_1$, of the particular portion of specimen 101 is scanned over zone $S_4$ of detector 180, image $A_2$, of an adjacent portion of specimen 101 is scanned over zone $S_3$ of detector 180, image $A_3$, of an adjacent portion of specimen 101 is scanned over zone $S_2$ of detector 180, and image $A_4$, of an adjacent portion of specimen 101 is scanned over zone $S_1$ of detector 180 at time, $T_4$. As illustrated in FIGS. 13A-D, image $A_1$, is detected by each of zones $S_1$-$S_4$, and is analyzed according to wavelength, polarization state, or both, by integration of signals 182 generated by hyperspectral TDI detector 180 at zones $S_1$-$S_4$ at the times, $T_1$-$T_4$, when image $A_1$, is detected by each of zones $S_1$-$S_4$. In a similar manner, all other images of different areas of specimen 101 are analyzed according to wavelength, polarization state, or both, by integration of signals 182 generated by hyperspectral TDI detector 180 at zones $S_1$-$S_4$ at the times when each image is detected by each of zones $S_1$-$S_4$.

In some examples, each image at each zone of the hyperspectral TDI detector is one pixel along the scan direction and many pixels perpendicular to the scan direction. In these examples, each image is captured as a one dimensional array of pixels. However, in other examples, each image at each zone of the hyperspectral TDI detector is multiple pixels along the scan direction and many pixels perpendicular to the scan direction. In some embodiments, each zone of the hyperspectral TDI detector includes different spectral bandpass filters, polarization analyzers, or both, enabling a scan of the same wafer location at several polarization states and wavelengths.

In general, a hyperspectral imaging based ellipsometer may be configured as a Mueller Matrix hyperspectral imaging based ellipsometer. In addition, a hyperspectral imaging based ellipsometer may include rotating polarization elements in any suitable configuration (e.g., rotating polarizer ellipsometer, rotating compensator ellipsometer, rotating polarizer, rotating compensator ellipsometer, rotating compensator, rotating compensator ellipsometer, etc.).

Similarly, a hyperspectral imaging based reflectometer may be configured as a Mueller Matrix hyperspectral imaging based reflectometer. In addition, a hyperspectral imaging based reflectometer may include rotating polarization elements in any suitable configuration (e.g., rotating polarizer reflectometer, rotating compensator reflectometer, rotating polarizer, rotating compensator reflectometer, rotating compensator, rotating compensator reflectometer, etc.). In general, a hyperspectral imaging based reflectometer may be configured for normal incidence illumination and collection or near normal angle of incidence illumination and collection as described hereinbefore with reference to FIG. 5.

A metrology system may include any suitable number of hyperspectral imaging based metrology tools. In addition, a metrology system may also include one or more non-imaging metrology tools operating cooperatively with one or more hyperspectral imaging based metrology tools. An exemplary non-imaging metrology tool includes any of a conventional spectroscopic ellipsometer, a rotating polarizer ellipsometer, a rotating compensator ellipsometer, a rotating polarizer, rotating compensator ellipsometer, a rotating compensator, rotating compensator elliposometer, a Mueller Matrix spectroscopic elliposmeter, a spectroscopic reflectometer, such as a spectroscopic reflectometer employing ultraviolet, extreme ultraviolet, or laser discharge sources, a Mueller Matrix spectroscopic reflectometer, a white light reflectometer, a fourier transform infrared spectrometer, a single wavelength ellipsometer, an imaging based overlay tool, a scatterometry based overlay tool, a scanning electron microscopy tool, a x-ray reflectometer, a soft x-ray reflectometer, etc.

In general a metrology system including one or more non-imaging metrology tools operating cooperatively with one or more hyperspectral imaging based metrology tools acquires more target data than either a hyperspectral imaging tool or a non-imaging metrology tool alone. In some examples, measurements performed by a hyperspectral imaging tool are employed as reference/calibration data for a non-imaging metrology tool, or vice-versa. In some examples, measurements performed by a hyperspectral imaging tool are collocated with measurements performed by a non-imaging metrology tool. In other examples, measurements performed by a hyperspectral imaging tool are not collocated with measurements performed by a non-imaging metrology tool. In some examples, measurements performed by a hyperspectral imaging tool are performed sequentially with measurements performed by a non-imaging metrology tool. In some examples, measurements performed by a hyperspectral imaging tool are performed simultaneously with measurements performed by a non-imaging metrology tool.

In some examples, a hyperspectral imaging tool captures a hyperspectral image of an entire die at high throughput. A non-imaging tool measures parameters of interest associated with a scribe line target. A signal response metrology (SRM) is used to estimate values of parameters of interest associated with intra-field, in-die targets or device areas based on the hyperspectral image data or a combination of the hyperspectral image data and the measurements of the scribe line target. In some examples, overlay is estimated based on device boundary alignment signals captured by a hyperspectral imaging tool. The device boundary alignments signals differentiate at different wavelengths, and are thus effectively captured by a hyperspectral imaging tool.

In some embodiments, different ranges of illumination wavelengths may be employed sequentially by a hyperspectral imaging tool. For example, a filter wheel may be employed to control the illumination wavelengths over time. Similarly, polarization states may be changed in a sequential manner. In some examples, discrete combinations of polarization states at the illumination side and the collection side may be employed (e.g., SS, SP, PS, and PP illumination/collection polarizations, respectively).

In some examples, hyperspectral image measurements of the backside of a wafer are performed. In some examples, the hyperspectral image measurements are performed in a reflective mode as illustrated in FIGS. 1 and 6. However, in some other examples, hyperspectral image measurements are performed in a transmissive mode. In some examples, a crossed polarizer/analyzer combination is employed to measure wafer stress due to cracks or patterning flaws. In some examples, a second or higher order harmonic frequency signal response of the wafer pattern is detected when excited by short pulse laser based illumination. For example, short pulse infrared illumination light is provided while the signal response is captured over a range of visible wavelengths. In some examples, the second or higher order harmonic frequency signal response is indicative of material asymmetry that results from stress induced micro-cracks in the wafer.

In yet another further aspect, the measurement results described herein can be used to provide active feedback to a process tool (e.g., lithography tool, etch tool, deposition tool, etc.). For example, values of measured parameters determined based on measurement methods described herein can be communicated to a lithography tool and cause the lithography tool to adjust the lithography system output (e.g., focus, dosage, etc.). In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to a lithography tool, etch tool, or deposition tool.

Figure 14:
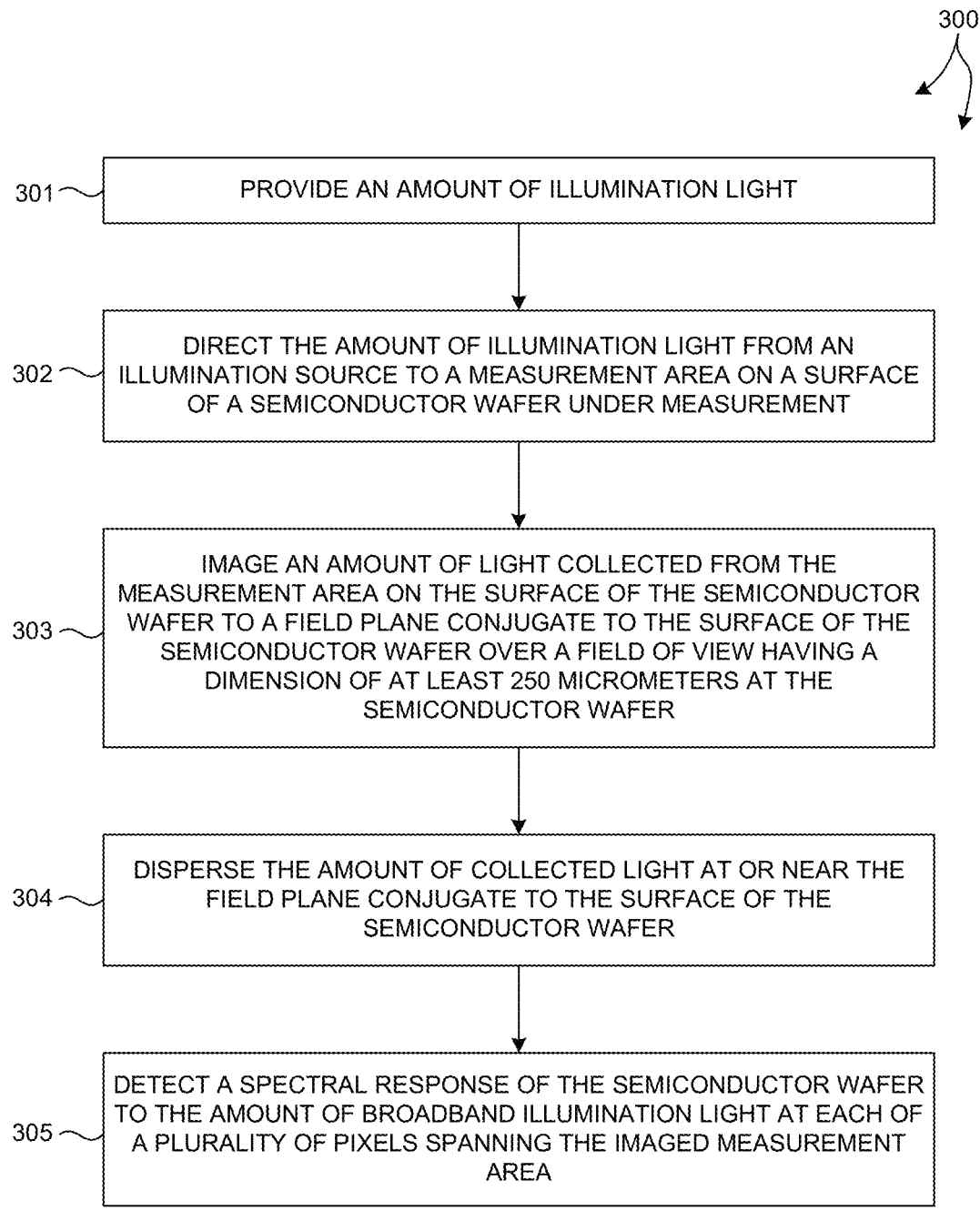
FIG. 14 illustrates a method 300 of performing hyperspectral imaging measurements in at least one novel aspect.

FIG. 14 illustrates a method 300 of performing hyperspectral imaging based measurements in at least one novel aspect. Method 300 is suitable for implementation by a metrology system such as metrology systems 100 and 200 illustrated in FIGS. 1 and 6, respectively. In one aspect, it is recognized that data processing blocks of method 300 may be carried out via a pre-programmed algorithm executed by one or more processors of computing system 130, or any other general purpose computing system. It is recognized herein that the particular structural aspects of metrology systems 100 and 200 do not represent limitations and should be interpreted as illustrative only.

In block 501, an amount of broadband illumination light is provided by an illumination source.

In block 502, the amount of illumination light is directed from an illumination source to a measurement area on a surface of a semiconductor wafer under measurement.

In block 503, an amount of light collected from the measurement area on the surface of the semiconductor wafer is imaged to a field plane conjugate to the surface of the semiconductor wafer over a field of view having a dimension of at least 250 micrometers at the semiconductor wafer.

In block 504, the amount of collected light is dispersed at or near the field plane conjugate to the surface of the semiconductor wafer.

In block 505, a spectral response of the semiconductor wafer to the amount of broadband illumination light at each of a plurality of pixels spanning the imaged measurement area is detected.

In a further embodiment, systems 100 and 200 include one or more computing systems 130 employed to perform measurements of semiconductor structures based on hyperspectral imaging measurement data collected in accordance with the methods described herein. The one or more computing systems 130 may be communicatively coupled to one or more detectors, active optical elements, etc. In one aspect, the one or more computing systems 130 are configured to receive measurement data associated with hyperspectral imaging measurements of structures of wafer 101.

It should be recognized that one or more steps described throughout the present disclosure may be carried out by a single computer system 130 or, alternatively, a multiple computer system 130. Moreover, different subsystems of systems 100 and 200, may include a computer system suitable for carrying out at least a portion of the steps described herein. Therefore, the aforementioned description should not be interpreted as a limitation on the present invention but merely an illustration.

In addition, the computer system 130 may be communicatively coupled to the hyperspectral detectors in any manner known in the art. For example, the one or more computing systems 130 may be coupled to computing systems associated with the hyperspectral detectors. In another example, the hyperspectral detectors may be controlled directly by a single computer system coupled to computer system 130.

The computer system 130 of the metrology systems 100 and 200 may be configured to receive and/or acquire data or information from the subsystems of the system (e.g., hyperspectral detectors and the like) by a transmission medium that may include wireline and/or wireless portions. In this manner, the transmission medium may serve as a data link between the computer system 130 and other subsystems of systems 100 and 200.

Computer system 130 of metrology systems 100 and 200 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board metrology systems 100 and 200, external memory, or other external systems). For example, the computing system 130 may be configured to receive measurement data from a storage medium (i.e., memory 132 or an external memory) via a data link. For instance, hyperspectral imaging data obtained using the hyperspectral detectors described herein may be stored in a permanent or semi-permanent memory device (e.g., memory 132 or an external memory). In this regard, the measurement results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, a metrology system, such as metrology systems 100 and 200, may be configured for measurement of patterned wafers and/or unpatterned wafers. A metrology system may be configured as a LED inspection tool, edge inspection tool, backside inspection tool, macro defect inspection tool, or multi-mode inspection tool (involving data from one or more platforms simultaneously), and any other metrology or inspection tool that benefits from hyperspectral imaging as described herein.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   one or more hyperspectral imaging based metrology tools each comprising:
   an illumination source configured to provide an amount of broadband illumination light;
   an optical subsystem configured to direct the amount of illumination light from the illumination source to a measurement area on a surface of the semiconductor wafer under measurement and image the measurement area on the surface of the semiconductor wafer to a field plane conjugate to the surface of the semiconductor wafer over a field of view having a dimension of at least 250 micrometers at the semiconductor wafer; and
   a spectrometer configured to disperse the imaged measurement area at or near the field plane conjugate to the surface of the semiconductor wafer; and
   a hyperspectral detector configured to detect a spectral response of the semiconductor wafer to the amount of broadband illumination light at each of a plurality of pixels spanning the imaged measurement area.

2. The metrology system of claim 1, wherein each hyperspectral imaging based metrology tool is configured as a reflectometer or an ellipsometer.

3. The metrology system of claim 1, wherein each of the plurality of pixels is characterized by an area having at least one dimension smaller than 50 micrometers.

4. The metrology system of claim 1, wherein the amount of broadband illumination light includes wavelengths ranging from 190 nanometers or less to 860 nanometers or more.

5. The metrology system of claim 1, wherein the optical subsystem is configured to direct the amount of illumination light from the illumination source to the measurement area on the surface of the semiconductor wafer at an oblique angle of incidence.

6. The metrology system of claim 5, wherein the measurement area is characterized by a first dimension less than 50 micrometers and a second dimension orthogonal to the first dimension greater than 1 millimeter.

7. The metrology system of claim 1, the optical subsystem comprising:
   a plurality of illumination fiber optical elements configured to direct the amount of illumination light from the illumination source to a measurement area on a surface of the semiconductor wafer; and
   a plurality of collection fiber optical elements configured to image the measurement area on the surface of the semiconductor wafer to the field plane conjugate to the surface of the semiconductor wafer.

8. The metrology system of claim 7, wherein the illumination fiber optical elements are the same fiber optical elements as the collection fiber optical elements.

9. The metrology system of claim 7, wherein the plurality of collection fiber optical elements image the measurement area on the surface of the semiconductor wafer to the field plane conjugate to the surface of the semiconductor wafer along a one dimensional array of pixels.

10. The metrology system of claim 9, wherein the spectrometer projects the imaged measurement area onto the hyperspectral detector along a first dimension of the hyperspectral detector and spatially disperses the imaged measurement area according to wavelength along a second dimension of the hyperspectral detector.

11. The metrology system of claim 1, wherein the hyperspectral detector includes a photosensitive area subdivided into a plurality of spatially distinct zones, wherein each zone of the plurality of spatially distinct zones is sensitive to a different polarization state or range of wavelengths.

12. The metrology system of claim 1, further comprising:
   one or more non-imaging metrology tools configured to perform measurements of the semiconductor wafer.

13. The metrology system of claim 12, wherein the measurements performed by the one or more non-imaging metrology tools and the spectral response at each of the plurality of pixels spanning the imaged measurement area are employed to estimate values of parameters of interest associated with intra-field, in-die targets or device areas.

14. A hyperspectral imaging based metrology tool, comprising:
   an illumination source configured to provide an amount of broadband illumination light;
   an optical subsystem configured to direct the amount of illumination light from the illumination source to a measurement area on a surface of the semiconductor wafer under measurement and image the measurement area on the surface of the semiconductor wafer to a field plane conjugate to the surface of the semiconductor wafer over a field of view having a dimension of at least 250 micrometers at the semiconductor wafer; and
   a spectrometer configured to disperse the imaged measurement area at or near the field plane conjugate to the surface of the semiconductor wafer; and
   a hyperspectral detector configured to detect a spectral response of the semiconductor wafer to the amount of broadband illumination light at each of a plurality of pixels spanning the imaged measurement area.

15. The hyperspectral imaging based metrology tool of claim 14, wherein the optical subsystem is configured to direct the amount of illumination light from the illumination source to the measurement area on the surface of the semiconductor wafer at an oblique angle of incidence.

16. The hyperspectral imaging based metrology tool of claim 14, the optical subsystem comprising:
   a plurality of illumination fiber optical elements configured to direct the amount of illumination light from the illumination source to a measurement area on a surface of the semiconductor wafer; and
   a plurality of collection fiber optical elements configured to image the measurement area on the surface of the semiconductor wafer to the field plane conjugate to the surface of the semiconductor wafer.

17. The hyperspectral imaging based metrology tool of claim 16, wherein the plurality of collection fiber optical elements image the measurement area on the surface of the semiconductor wafer to the field plane conjugate to the surface of the semiconductor wafer along a one dimensional array of pixels.

18. The hyperspectral imaging based metrology tool claim 14, wherein the spectrometer projects the imaged measurement area onto the hyperspectral detector along a first dimension of the hyperspectral detector and spatially disperses the imaged measurement area according to wavelength along a second dimension of the hyperspectral detector.

19. The hyperspectral imaging based metrology tool of claim 14, wherein the hyperspectral detector includes a photosensitive area subdivided into a plurality of spatially distinct zones, wherein each zone of the plurality of spatially distinct zones is sensitive to a different polarization state or range of wavelengths.

20. A method comprising:

providing an amount of broadband illumination light;

directing the amount of illumination light from an illumination source to a measurement area on a surface of a semiconductor wafer under measurement;

imaging an amount of light collected from the measurement area on the surface of the semiconductor wafer to a field plane conjugate to the surface of the semiconductor wafer over a field of view having a dimension of at least 250 micrometers at the semiconductor wafer;

dispersing the amount of collected light at or near the field plane conjugate to the surface of the semiconductor wafer; and detecting a spectral response of the semiconductor wafer to the amount of broadband illumination light at each of a plurality of pixels spanning the imaged measurement area.

21. The metrology system of claim 1, further comprising:

a computing system configured to:

estimate a value of a parameter of interest of the semiconductor wafer based on the detected spectral response of the semiconductor wafer to the amount of broadband illumination light at each of the plurality of pixels spanning the imaged measurement area.

22. The metrology system of claim 1, wherein the illumination source is further configured to provide a second amount of broadband illumination light the optical subsystem is further configured to direct the second amount of illumination light from the illumination source to a measurement area on a surface of a Design Of Experiments (DOE) semiconductor wafer under measurement and image the measurement area on the surface of the DOE semiconductor wafer to a field plane conjugate to the surface of the DOE semiconductor wafer over a field of view having a dimension of at least 250 micrometers at the DOE semiconductor wafer; the spectrometer is further configured to disperse the imaged measurement area at or near the field plane conjugate to the surface of the DOE semiconductor wafer; the hyperspectral detector is further configured to detect a spectral response of the DOE semiconductor wafer to the second amount of broadband illumination light at each of a plurality of pixels spanning the imaged measurement area, and further comprising:

a computing system configured to:

train a signal response metrology model based in part on a detected spectral response of the DOE semiconductor wafer to the second amount of broadband illumination light at each of the plurality of pixels spanning the imaged measurement area.

23. The metrology system of claim 22, the computing system further configured to:

estimate a value of a parameter of interest based on the trained signal response model and the detected spectral response of the semiconductor wafer to the amount of broadband illumination light at each of the plurality of pixels spanning the imaged measurement area.

* * * * *